United States Patent
Chang et al.

(10) Patent No.: US 7,791,541 B2
(45) Date of Patent: Sep. 7, 2010

(54) PRINTED CIRCUIT BOARD

(75) Inventors: Ki Won Chang, Gyunggi-do (KR); Jeong Sik Seo, Gyunggi-do (KR); Hyun Do Park, Gyunggi-do (KR); Jae Suk Sung, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 205 days.

(21) Appl. No.: 11/944,571

(22) Filed: Nov. 23, 2007

(65) Prior Publication Data

US 2008/0122713 A1  May 29, 2008

(30) Foreign Application Priority Data

Nov. 22, 2006  (KR) .................. 10-2006-0115951

(51) Int. Cl.
*H01Q 1/38* (2006.01)
(52) U.S. Cl. ................... 343/700 MS; 343/702
(58) Field of Classification Search .......... 343/700 MS, 343/702
See application file for complete search history.

(56) References Cited

U.S. PATENT DOCUMENTS

| | | | |
|---|---|---|---|
| 5,861,854 A | 1/1999 | Kawahata et al. | |
| 6,762,731 B1 * | 7/2004 | Chou | 343/882 |
| 7,034,752 B2 | 4/2006 | Sekiguchi et al. | |
| 7,265,724 B1 | 9/2007 | Tan et al. | |
| 2003/0132885 A1 * | 7/2003 | Kuramoto et al. | 343/702 |
| 2003/0222827 A1 | 12/2003 | Sung | |
| 2004/0246180 A1 * | 12/2004 | Okado | 343/700 MS |
| 2009/0040109 A1 | 2/2009 | Iguchi et al. | |

FOREIGN PATENT DOCUMENTS

| | | |
|---|---|---|
| EP | 1 146 589 A1 | 10/2001 |
| EP | 1 267 441 A3 | 12/2002 |
| EP | 1 482 592 A1 | 1/2004 |
| EP | 1 564 837 A2 | 8/2005 |
| EP | 1860732 A1 | 11/2007 |
| JP | 2001-36317 A | 2/2001 |
| JP | 2006295876 A | 10/2006 |
| WO | 2005-078860 A1 | 8/2005 |
| WO | 2006-000631 A1 | 1/2006 |
| WO | 2006098089 A1 | 9/2006 |

OTHER PUBLICATIONS

UK Intellectual Property Office English Language Search Report, mailed Mar. 17, 2008.
UKIPO Search Report issued Sep. 9, 2008.
Korean Intellectual Property Office Search Report issued Sep. 9, 2008.
German Office Action for Application No. 10 2007 056.8-55, issued Jun. 10, 2010.

* cited by examiner

*Primary Examiner*—Douglas W Owens
*Assistant Examiner*—Dieu Hien T Duong
(74) *Attorney, Agent, or Firm*—Lowe Hauptman Ham & Berner LLP

(57) ABSTRACT

There is provided a printed circuit board comprising: a mounting area of a chip antenna provided on one surface thereof, and a tuning ground pattern formed on a surface opposing the one surface of the printed circuit board to have one end connected to a ground part so as to be used for tuning frequency characteristics of the chip antenna.

6 Claims, 5 Drawing Sheets

PRINTED CIRCUIT BOARD

CROSS-REFERENCE TO RELATED APPLICATIONS

This application claims the priority of Korean Patent Application No. 2006-115951 filed on Nov. 22, 2006, in the Korean Intellectual Property Office, the disclosure of which is incorporated herein by reference.

BACKGROUND PART OF THE INVENTION

1. Field of the Invention

The present invention relates to a chip antenna and a mobile telecommunication terminal having the same, and more particularly, to a chip antenna having a plurality of conductive patterns capacitively coupled to a conductive pattern connected to a feeding part, a mobile telecommunication terminal having the chip antenna, and a printed circuit board for use in the mobile telecommunication terminal.

2. Description of the Related Art

In a mobile telecommunication field, an antenna is a passive device whose characteristics are susceptible to ambient environment. The antenna is installed in a base station, or attached to a relay device or a wireless telecommunication device. The antenna receives an electric wave from the outside or transmits an electrical signal generated from a telecommunication device, to the outside.

A chip antenna assembled inside the mobile telecommunication terminal requires each terminal to be optimized in characteristics such as standing wave ratio (SWR) matching. A narrower bandwidth of the chip antenna necessitates a greater number of experiments for optimization. On the other hand, a broader bandwidth of the chip antenna decreases the number of experiments, thereby shortening development time.

In a conventional chip antenna, a radiation pattern is formed on a dielectric block to connect to a feeding part and a ground part, accordingly requiring an electromagnetic coupling feeding structure and a radiator to be designed for a specific frequency band. However, there have been limitations in designing the chip antenna with broadband characteristics by virtue of such a feeding structure.

In addition, the chip antenna, when assembled inside the mobile telecommunication terminal, is altered in frequency characteristics, inevitably entailing a tuning process thereof. This tuning process brings about a change in design of an antenna pattern or dielectric block, thereby degrading manufacturing efficiency.

SUMMARY OF THE INVENTION

An aspect of the present invention provides a chip antenna having broadband frequency characteristics and a good standing wave ratio (SWR) in a broadband frequency range.

An aspect of the present invention also provides a mobile telecommunication terminal including a board having a pattern used for tuning a resonant frequency when a chip antenna is assembled inside a mobile telecommunication terminal.

An aspect of the present invention also provides a printed circuit board, which enables tuning of a resonant frequency of a chip antenna to be assembled inside a mobile telecommunication terminal.

According to an aspect of the present invention, there is provided a chip antenna including: a dielectric block having opposing top and bottom surfaces and a plurality of side surfaces connecting the top and bottom surfaces; a first conductive pattern formed on at least one of the surfaces of the dielectric block to connect to an external feeding part; a second conductive pattern formed on at least one of the surfaces of the dielectric block, the second conductive pattern spaced apart from the first conductive pattern at a certain distance so as to be capacitively coupled to the first conductive pattern to act as a radiator, the second conductive pattern having one end connected to an external ground part; and a third conductive pattern formed on at least one of the surfaces of the dielectric block, the third conductive pattern spaced apart from the first conductive pattern at a certain distance so as to be capacitively coupled to the first conductive pattern to enable impedance matching of the antenna, the third conductive pattern having a lower end connected to the external ground part, wherein a coupling capacitance between the first and second conductive patterns is greater than a coupling capacitance between the first and third conductive patterns.

The dielectric block may be shaped as a rectangular parallelepiped. The first and second conductive patterns may define a radiator by capacitive coupling, wherein the radiator is formed across a first side surface parallel to a longitudinal direction of the dielectric block, the top surface and a second side surface opposing the first side surface of the dielectric block.

The first conductive pattern may be formed on the first side surface parallel to the longitudinal direction of the dielectric block. The first conductive pattern may be formed such that a spacing between the first conductive pattern and the top surface of the dielectric block is smaller than a spacing between the first conductive pattern and the bottom surface of the dielectric block.

The first conductive pattern may be L-shaped. The first conductive pattern may have an upper end in contact with an intersecting line between the first side surface and the top surface of the dielectric block.

The second conductive pattern may be formed across the second side surface opposing the first side surface of the dielectric block and the top surface thereof. The second conductive pattern may have another end spaced apart from the intersecting line between the top surface and the first side surface of the dielectric block.

The third conductive pattern may be formed on the bottom surface of the dielectric block. The third conductive pattern may have the lower end in contact with an intersecting line between the bottom surface and the first side surface of the dielectric body, the third conductive pattern having at least one bending.

The first conductive pattern may be formed on the first side surface of the dielectric block and have an L shape such that an upper end of the first conductive pattern is in contact with an intersecting line between the first side surface and the top surface of the dielectric block, the second conductive pattern is formed across the second side surface opposing the first side surface of the dielectric block and the top surface thereof, the second conductive pattern having another end spaced apart at a certain distance from the intersecting line between the top surface and the first surface of the dielectric block, and the third conductive pattern may be formed on the bottom surface of the dielectric block and have the lower end in contact with an intersecting line between the bottom surface and the first side surface of the dielectric block, the third conductive pattern having at least one bending.

According to another aspect of the present invention, there is provided a mobile telecommunication terminal including: a chip antenna including: a dielectric block having opposing top and bottom surfaces and a plurality of side surfaces connecting the top and bottom surfaces; a first conductive pattern formed on at least one of the surfaces of the dielectric block to connect to an external feeding part; a second conductive pattern formed on at least one of the surfaces of the dielectric block, the second conductive pattern spaced apart from the first conductive pattern at a certain distance so as to be capacitively coupled to the first conductive pattern to act as a radiator, the second conductive pattern having one end connected to an external ground part; and a third conductive pattern formed on at least one of the surfaces of the dielectric block, the third conductive pattern spaced apart from the first conductive pattern at a certain distance so as to be capacitively coupled to the first conductive pattern to enable impedance matching of the antenna, the third conductive pattern having a lower end connected to the external ground part, and a printed circuit board having the chip antenna mounted on one surface thereof, the printed circuit board comprising a tuning ground pattern formed on a surface opposing the one surface of the printed circuit board to have one end connected to a ground part so as to be used for tuning frequency characteristics of the chip antenna.

The tuning ground pattern may have an open-square shape defined along an edge of a portion corresponding to a mounting area of the chip antenna. The tuning ground pattern may have ruler markings to facilitate tuning.

According to still another aspect of the present invention, there is provided a printed circuit board including: a board having a first surface providing a mounting area of a chip antenna and a second surface opposing the first surface; a feeding signal line formed on the first surface to extend to the mounting area of the chip antenna; and a tuning pattern formed on an area allowing capacitive coupling to a conductive component of the chip antenna to be mounted, the tuning pattern at least partially removable so that the coupling capacitance between the tuning pattern and the conductive component is changed to tune frequency characteristics of the chip antenna.

The tuning pattern may be formed on a portion of the second surface corresponding to the mounting area of the chip antenna. The tuning pattern may be a line bent at least once.

The tuning pattern may have an open-square shape defined along an edge of a portion corresponding to the mounting area of the chip antenna.

The board may have a ground part and the tuning pattern may be connected to the ground part.

The ground part may include a first ground part formed on the first surface of the board and a second ground part formed on the second surface to connect to the tuning pattern, wherein the board further includes at least one ground part line formed on the first surface to extend from the first ground part to the mounting area of the chip antenna.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
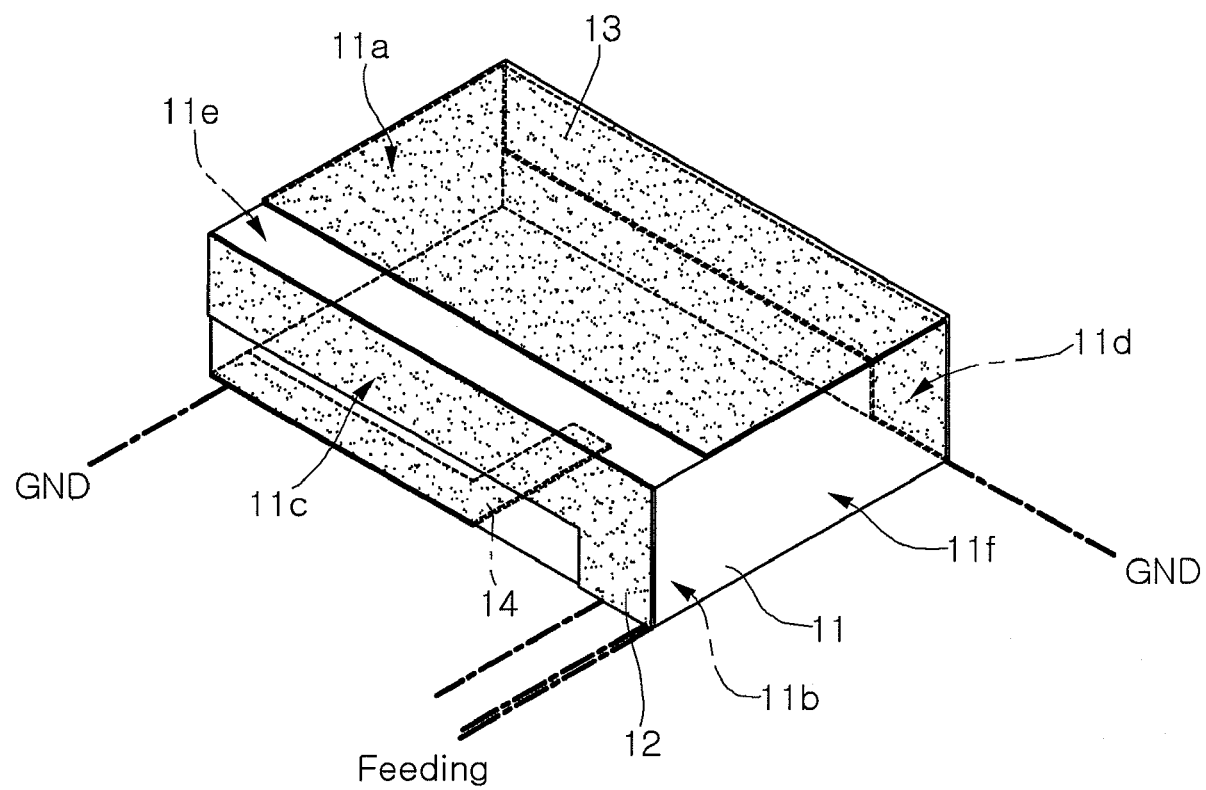
FIGS. 1A and 1B are a perspective view and a cross-sectional view illustrating a chip antenna, respectively according to an exemplary embodiment of the invention.
Figure 1B:
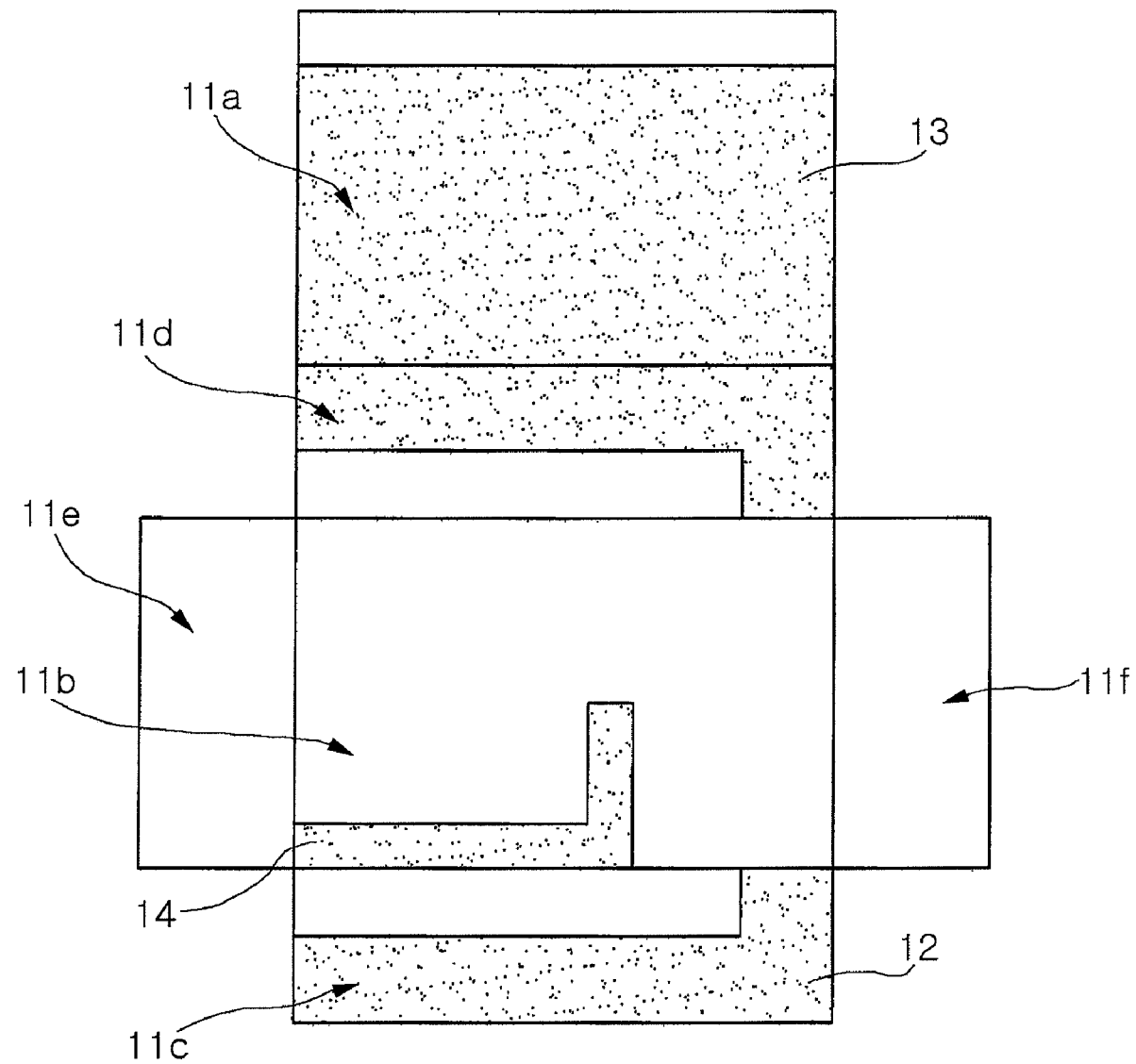

FIGS. 1A and 1B are a perspective view and a cross-sectional view illustrating a chip antenna, respectively according to an exemplary embodiment of the invention.

Referring to FIGS. 1A and 1B, the chip antenna of the present embodiment includes a dielectric block 11, a first conductive pattern 12, a second conductive pattern 13 and a third conductive pattern 14.

The dielectric block 11 may be shaped as a rectangular parallelepiped. The dielectric block 11 has a top surface 11a and a bottom surface 11b opposing each other, and first to fourth side surfaces 11c, 11d, 11e, and 11f connecting the top surface 11a and the bottom surface 11b. The bottom surface 11b of the dielectric block is brought in contact with a board when an antenna is mounted on the board.

The dielectric block 11 may be formed of a ceramic material.

A first conductive pattern 12 is formed on the first side surface 11c of the dielectric block 11 and a second conductive pattern 13 is formed on the top surface 11a and the second side surface 11d of the dielectric block 11. The first and second conductive patterns 12 and 13 are spaced apart from each other at a certain distance to be capacitively coupled to each other.

The first conductive pattern 12 has one end connected to an external feeding part to provide a signal to the antenna. The second conductive pattern 13 is spaced apart from the first conductive pattern 12 at a certain distance to be capacitively coupled to the first conductive pattern 12. The second conductive pattern 13 has one end connected to an external ground part. The first conductive pattern 12 and the second conductive pattern 13 are capacitively coupled to each other to act as a radiator of the antenna.

To utilize outer surfaces of the dielectric block of a rectangular parallelepiped shape with the greatest efficiency, the radiator defined by capacitive coupling between the first and second conductive patterns 12 and 13 may be formed across the first side surface 11c, the top surface 11a and the second side surface 11d of the dielectric block.

In the present embodiment, the first conductive pattern 12 is formed on the first side surface 11c parallel to a longitudinal direction of the dielectric block and the second conductive pattern 13 is formed across the second side surface 11d and the top surface 11a of the dielectric block.

The first conductive pattern 12 is L-shaped. With such a shape, the first conductive pattern 12 can be spaced apart at a distance from the ground part on the board where the chip antenna is mounted to connect to the external feeding part. The first conductive pattern 12 has an upper end in contact with an intersecting line between the first side surface 11c and the top surface 11a of the dielectric block.

The first conductive pattern 12 is capacitively coupled to the second conductive pattern 13 and the third conductive pattern 14, respectively, which will be described later. However, a coupling capacitance between the first conductive pattern 12 and the third conductive pattern 14 is relatively weaker than a coupling capacitance between the first conductive pattern 12 and the second conductive pattern 13.

Therefore, the first and second conductive patterns 12 and 13 act as the antenna radiator, while the third conductive pattern 14 serves to alter impedance characteristics of the antenna.

This magnitude of capacitive coupling may be controlled by adjusting a spacing of the conductive patterns from one another or an area adjacent to one another.

In the present embodiment, to adjust the magnitude of coupling capacitance of the first to third conductive patterns, the first conductive pattern 12 is L-shaped and has the upper end in contact with the intersecting line between the first side surface 11c and the top surface 11a of the dielectric block.

The second conductive pattern 13 is formed on the second side surface 11d to extend onto the top surface 11a of the dielectric block 11. A portion of the second conductive pattern formed on the second side surface 11d of the dielectric block 11 corresponds to the first conductive pattern 12. Also, a portion of the second conductive pattern formed on the top surface 11a of the dielectric block 11 is spaced apart at a certain distance from the intersecting line between the first side surface 11c and the top surface 11a of the dielectric block 11, and formed to correspond to a width of the first conductive pattern 12.

The first conductive pattern 12 has the one end connected to the feeding part to receive a signal from the outside, and the second conductive pattern 13 has the one end connected to the ground part.

The signal inputted from the outside is fed to the second conductive pattern 13 which is spaced apart at a certain distance from the first conductive pattern 12 to be capacitively coupled to each other. Thus, the first conductive pattern 12 and the second conductive pattern 13 act as the antenna radiator.

The first conductive pattern and the second conductive pattern formed on the three side surfaces of the rectangular parallelepiped dielectric block may be configured variously. That is, the first and second conductive patterns may be spaced apart from each other at a certain distance on the top surface 11a or the second side surface 11d of the dielectric body.

The third conductive pattern 14 is formed on the bottom surface 11b of the dielectric block 11 and has a lower end connected to the external ground part.

The third conductive pattern 14 is capacitively coupled to the first conductive pattern 12 to enable impedance matching of the antenna.

The third conductive pattern 14 can be varied in length to adjust impedance matching of the overall antenna. That is, with a smaller length of the third conductive pattern 14, the antenna has a higher resonant frequency. On the other hand, with a greater length of the third conductive pattern 14, the antenna has a lower resonant frequency.

The third conductive pattern 14 may have the lower end in contact with an intersecting line between the bottom surface 11b and the first side surface 11c of the dielectric block. The third conductive pattern 14 may have at least one bending formed thereon to maintain a certain length.

Figure 2:
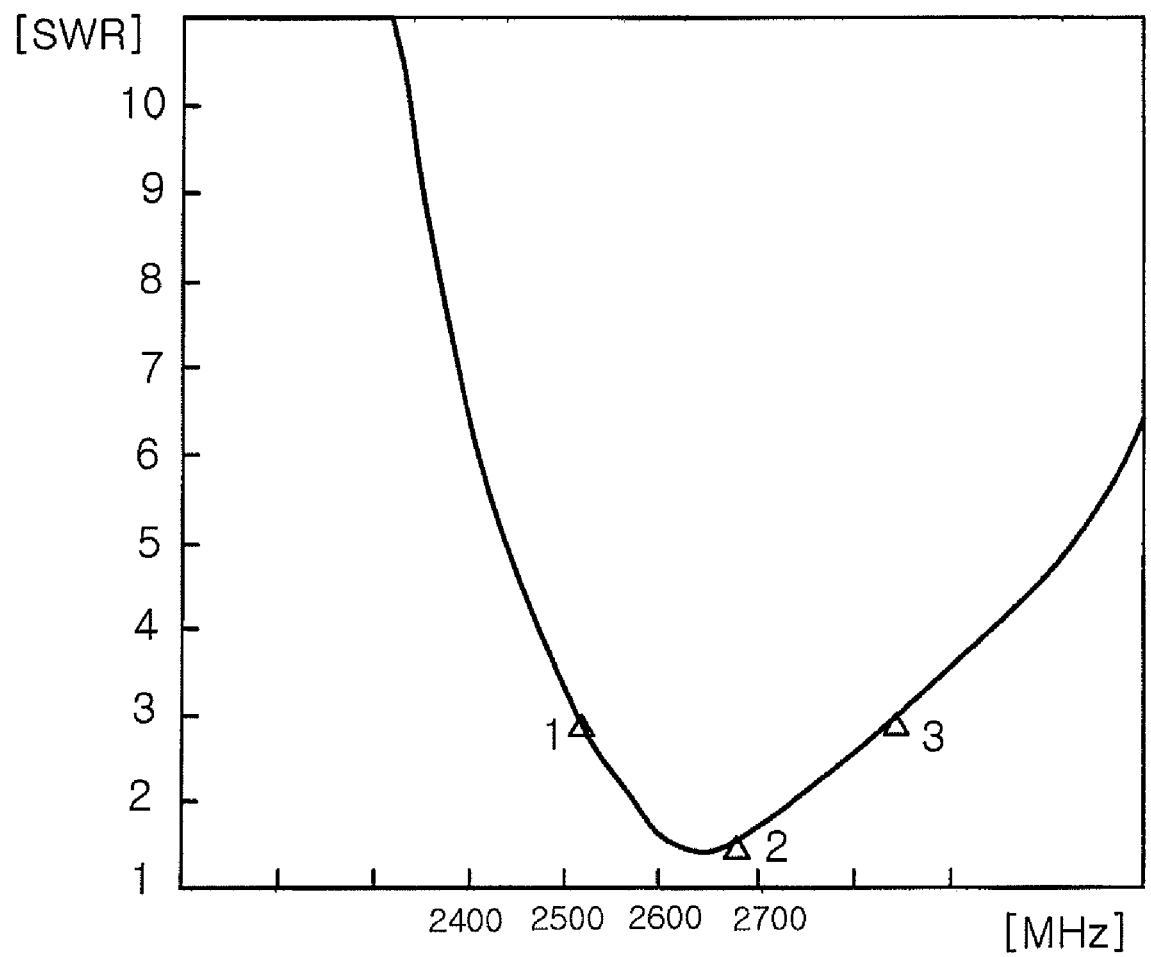
FIG. 2 is a graph illustrating standing wave ratio characteristics of the chip antenna of FIG. 1.

FIG. 2 is a graph illustrating a standing wave ratio (SWR) of a chip antenna according to an exemplary embodiment of the invention.

In the graph of FIG. 2, an x axis indicates frequency (MHz) and a y axis indicates the SWR.

Here, the SWR denotes a ratio between an output signal and a reflection signal of the antenna. The SWR is optimal at 1, in which there are no reflected waves. Meanwhile, the SWR of 3 or more does not ensure the antenna characteristics.

In the present embodiment, a chip antenna with a size of 40×40×1.0 [mm³] having first to third conductive patterns formed thereon was mounted on a printed circuit board (PCB) made of an FR4 material to measure the SWR thereof.

According to the present embodiment, as shown in FIG. 2, the SWR is plotted at 3 or less in a frequency band of 2520 to 2850 [MHz], thus demonstrating a superior SWR in a relatively broad bandwidth of 330 [MHz].

In a case where the antenna of the present embodiment employs the antenna of FIG. 1 without the third conductive pattern 14 provided thereon, the SWR characteristics may be degraded compared with the present embodiment. That is, in the SWR graph, a curve may be shifted upward overall, thereby narrowing a frequency band at an identical SWR compared with the present embodiment.

In the present embodiment, the third conductive pattern is formed to be capacitively coupled to the radiation pattern of the antenna. This assures easier impedance matching of the overall antenna, thereby realizing a chip antenna with broadband characteristics and antenna characteristics in a broadband frequency range.

Also, although not illustrated, with regard to gain and radiation pattern characteristics according to the present embodiment, an average gain is plotted at −3[dBi] or more in a frequency band of 2485 MHz to 2885 MHz, thereby ensuring an operable antenna. Moreover, the antenna exhibits superior characteristics, with an efficiency of 80%, an average gain of −0.98[dBi], a peak gain of 3.02[dBi], and a directivity of 4.0[dBi] when the resonant frequency is 2645 MHz.

Figure 3A:
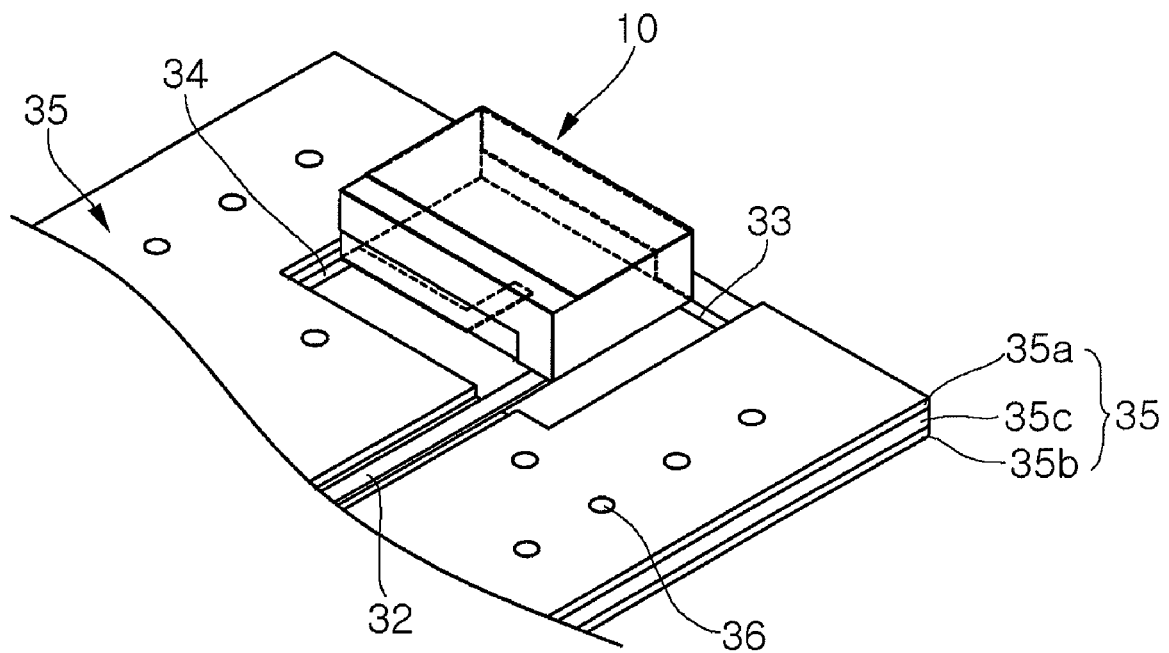
FIGS. 3A and 3B are a perspective view and a rear view illustrating a board where a tuning ground pattern included in a mobile telecommunication terminal is formed according to an exemplary embodiment of the invention.
Figure 3B:
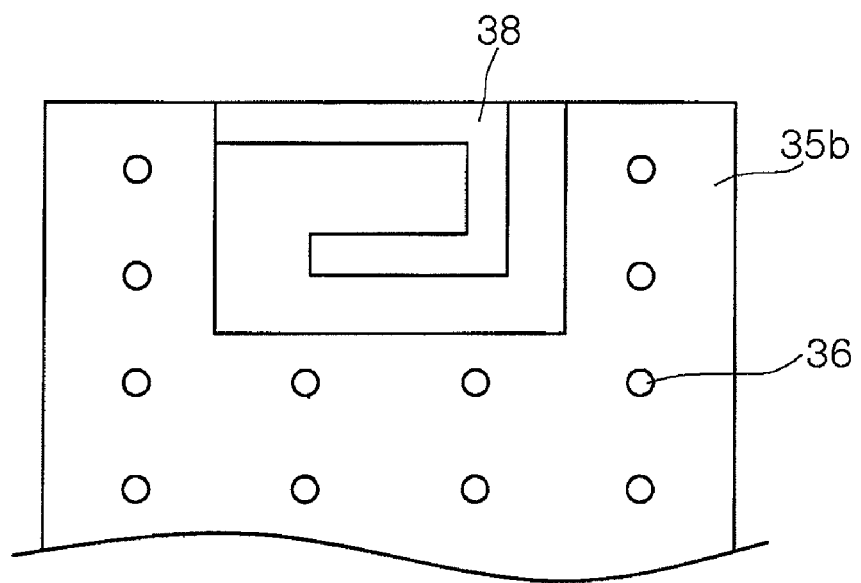

FIGS. 3A and 3B are a perspective view and a rear view illustrating a printed circuit board where a tuning ground pattern included in a mobile telecommunication terminal is formed, respectively according to an exemplary embodiment of the invention.

Referring to FIGS. 3A and 3B, the printed circuit board 35 having a chip antenna mounted thereon includes a board 35c made of a typical PCB board material and ground parts 35a and 35b formed on both surfaces of the board. The ground parts 35a and 35b are connected to each other by a plurality of via holes 36.

The chip antenna 10 is mounted on one of the surfaces of the board 35c, particularly on a portion of the board 35c where the ground part 35a is not formed.

In a case where the chip antenna 10 is the chip antenna shown in FIG. 1, a first conductive pattern of the chip antenna 10 is connected to a feeding signal line 32 on the board to receive a signal. Also, second and third conductive patterns may be connected to the ground part 35a by the first and second ground part liens 33 and 34, respectively.

The ground part 35b is not formed on a portion corresponding to a mounting surface of the chip antenna 10, in a rear surface of the PCB 35 opposing the surface where the chip antenna 10 is mounted, thereby allowing the board 35c to be exposed directly. A tuning ground pattern 38 is formed along an edge of the portion corresponding to the mounting surface of the chip antenna on the board exposed 35c. The tuning ground pattern 38 may have one end connected to the ground part 35b.

The tuning ground pattern 38 may have at least one bending to maintain a certain length. The tuning ground pattern 38 is capacitively coupled to the chip antenna 10 mounted on the opposite surface of the printed circuit board 35, thereby varying frequency characteristics of the antenna according to the length of the ground pattern 38.

In the present embodiment, the ground pattern 38 is formed in an open-square shape along an edge of a portion corresponding to the mounting surface of the chip antenna on the board 35c to have one end connected to the ground part 35b. An open end of the ground pattern may begin to be partially cut to adjust the length of the tuning ground pattern 38.

To facilitate tuning of the ground pattern, ruler markings may be formed on the tuning ground pattern 38. In the present embodiment, the ruler markings have a spacing of 1 mm.

This tuning ground pattern 38 enables easier tuning of frequency characteristics essentially required for assembling the board with the chip antenna 10 thereon inside the mobile telecommunication terminal. That is, the tuning ground pattern 38 can be adjusted in length without re-designing the conductive pattern or dielectric block formed on the chip antenna 10, thereby changing a resonant frequency of the chip antenna 10.

Figure 4:
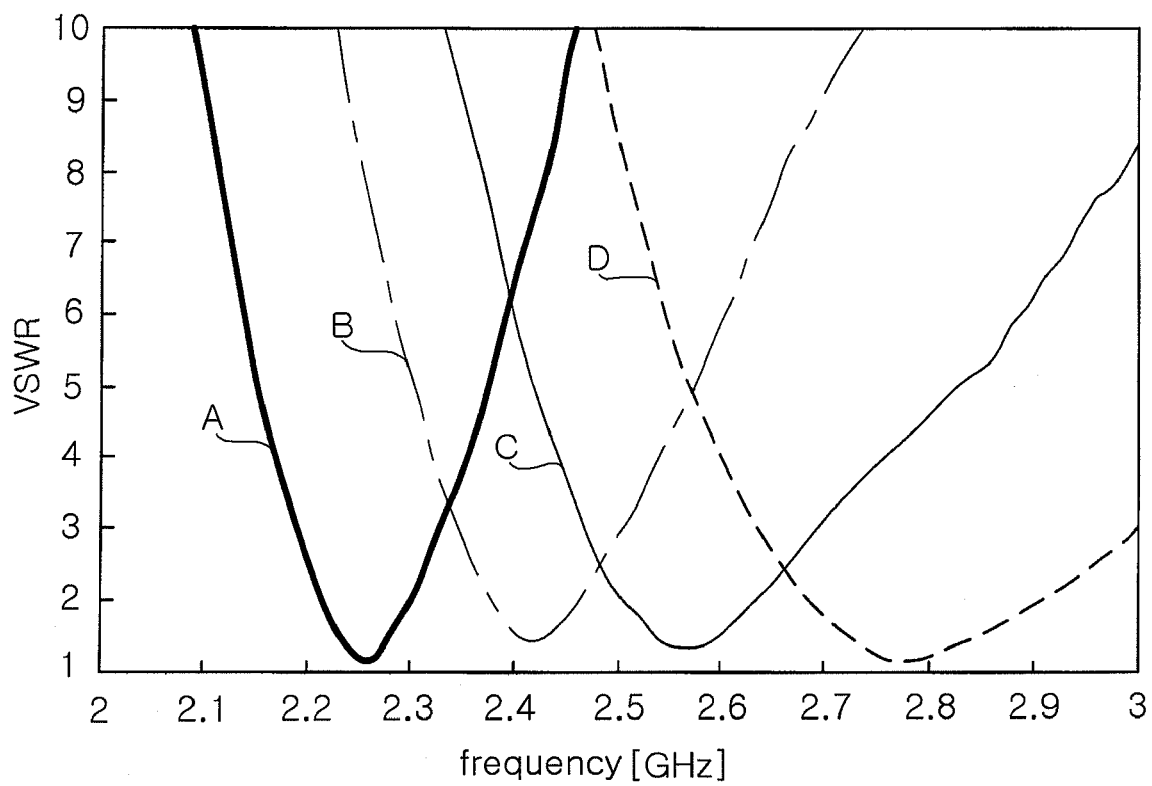
FIG. 4 is a graph illustrating a change in antenna characteristics according to a change in a length of a tuning ground pattern in the mobile telecommunication terminal of FIG. 3.

FIG. 4 is a graph illustrating a change in antenna characteristics according to a change in a length of a tuning ground pattern in the mobile telecommunication terminal of FIG. 3.

According to the present embodiment, a chip antenna with a size of 6×2×1.5 [mm$^3$] having first to third conductive patterns formed thereon was mounted on a test board made of an FR4 material, and a tuning ground pattern of 15 mm was formed on a rear surface of the board. In the graph of FIG. 4, a change in a resonant frequency of the antenna is plotted with a gradual decrease in the length of the tuning ground pattern.

Referring to FIG. 4, a change in the length of the tuning ground pattern leads to a change in the resonant frequency of the antenna.

That is, when the tuning ground pattern has a length of 8 mm (D), the resonant frequency is about 2.8 GHz. Also, when the length is about 6 mm, 4 mm and 0 mm, the resonant frequency is about 2.55 GHz (C), 2.4 GHz (B), and 2.25 GHz (A), respectively. Based on these experimental results, according to the present embodiment, a frequency of about 65 MHz is changed per 1 mm of the tuning ground pattern. According to the present embodiment, one chip antenna alone can cover a 2 GHz frequency band. Therefore, the chip antenna can be employed as an industrial, scientific and medical (ISM) frequency band and a satellite-digital multimedia broadcasting (S-DMB) chip antenna.

Furthermore, with a change in the length of the tuning ground pattern, the antenna has a resonant frequency changed but maintains the SWR ratio constant.

Although not illustrated, with regard to gain and radiation pattern according to the present embodiment, the antenna exhibits an average gain of at least −3 dBi at a bandwidth of 84 MHz around the resonant frequency before and after the ground pattern is removed.

As described above, the present invention shall not be limited to the aforesaid embodiments and attached drawings. That is, a shape of the dielectric block and shapes and arrangements of conductive patterns may be variously modified.

As set forth above, according to exemplary embodiments of the invention, a chip antenna exhibits broadband characteristics and good antenna characteristics in a broadband frequency range. Also, a mobile telecommunication terminal includes a board in which frequency characteristics of the antenna can be easily tuned when the chip antenna is assembled inside the terminal.

While the present invention has been shown and described in connection with the exemplary embodiments, it will be apparent to those skilled in the art that modifications and variations can be made without departing from the spirit and scope of the invention as defined by the appended claims.

What is claimed is:

1. A printed circuit board comprising:
a mounting area of a chip antenna provided on one surface thereof; and
a tuning ground pattern formed on an exposed part in a rear surface opposing the one surface of the printed circuit board, the tuning ground pattern having one end connected to a ground part of the printed circuit board so as to be used for tuning frequency characteristics of the chip antenna;
wherein the ground part comprises a first ground part formed on the first surface of the board and a second ground part formed on the second surface to connect to the tuning pattern,
wherein the board further comprises at least one ground part line formed on the first surface to extend from the first ground part to the mounting area of the chip antenna.

2. The printed circuit board of claim 1, wherein the tuning ground pattern has an open-square shape defined along an edge of a portion corresponding to the mounting area of the chip antenna.

3. A printed circuit board comprising:
a board having a first surface providing a mounting area for a chip antenna and a second surface opposing the first surface, the second surface being a rear surface of the board;
a feeding signal line formed on the first surface to extend to the mounting area of the chip antenna; and
a tuning pattern formed on an exposed part of the second surface, providing capacitive coupling to a conductive component of the chip antenna to be mounted thereto, the tuning pattern at least partially removable so that the coupling capacitance between the tuning pattern and the conductive component is changed to tune frequency characteristics of the chip antenna;
wherein tuning pattern is a ground pattern, the board has a ground part and the tuning pattern is connected to the ground part;
wherein the ground part comprises a first ground part formed on the first surface of the board and a second ground part formed on the second surface to connect to the tuning pattern,
wherein the board further comprises at least one ground part line formed on the first surface to extend from the first ground part to the mounting area of the chip antenna.

4. The printed circuit board of claim 3, wherein the tuning pattern is formed on a portion of the second surface corresponding to the mounting area of the chip antenna.

5. The printed circuit board of claim 4, wherein the tuning pattern is a line bent at least once.

6. The printed circuit board of claim 5, wherein the tuning pattern has an open-square shape defined along an edge of a portion corresponding to the mounting area of the chip antenna.

* * * * *